(12) United States Patent
Fujiwara et al.

(10) Patent No.: US 12,202,930 B2
(45) Date of Patent: Jan. 21, 2025

(54) ROOM-TEMPERATURE-CURABLE POLYBUTADIENE RESIN COMPOSITION, METHOD FOR PRODUCING SAME, AND PACKAGED CIRCUIT BOARD

(71) Applicant: SHIN-ETSU CHEMICAL CO., LTD., Tokyo (JP)

(72) Inventors: Akitsugu Fujiwara, Annaka (JP); Takafumi Sakamoto, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 806 days.

(21) Appl. No.: 17/265,304

(22) PCT Filed: Jul. 10, 2019

(86) PCT No.: PCT/JP2019/027272
§ 371 (c)(1),
(2) Date: Feb. 2, 2021

(87) PCT Pub. No.: WO2020/026731
PCT Pub. Date: Feb. 6, 2020

(65) Prior Publication Data
US 2021/0301066 A1  Sep. 30, 2021

(30) Foreign Application Priority Data
Aug. 3, 2018  (JP) .................. 2018-146882

(51) Int. Cl.
| | |
|---|---|
| C08G 18/69 | (2006.01) |
| C08G 18/04 | (2006.01) |
| C08G 18/10 | (2006.01) |
| C08G 18/24 | (2006.01) |
| C08G 18/76 | (2006.01) |
| C08G 18/83 | (2006.01) |
| C08G 77/00 | (2006.01) |
| C09D 175/04 | (2006.01) |
| C09D 175/14 | (2006.01) |
| H05K 3/28 | (2006.01) |

(52) U.S. Cl.
CPC ............ *C08G 18/69* (2013.01); *C08G 18/04* (2013.01); *C08G 18/10* (2013.01); *C08G 18/242* (2013.01); *C08G 18/246* (2013.01); *C08G 18/7621* (2013.01); *C08G 18/833* (2013.01); *C08G 18/837* (2013.01); *C08G 77/00* (2013.01); *C09D 175/04* (2013.01); *C09D 175/14* (2013.01); *H05K 3/28* (2013.01); *H05K 3/282* (2013.01); *H05K 3/284* (2013.01); *H05K 3/285* (2013.01); *C08G 2150/00* (2013.01); *H05K 2201/0133* (2013.01); *H05K 2201/0162* (2013.01)

(58) Field of Classification Search
CPC ..... C08G 18/69; C08G 18/833; C08G 18/837
See application file for complete search history.

(56) References Cited

U.S. PATENT DOCUMENTS

| | | | | |
|---|---|---|---|---|
| 5,254,657 A | * | 10/1993 | Inoue ................. | C08L 83/14 528/34 |
| 7,405,259 B2 | * | 7/2008 | Frye .................. | C08G 18/69 528/30 |
| 2003/0105206 A1 | | 6/2003 | Hara et al. | |
| 2005/0215706 A1 | | 9/2005 | Sakamoto et al. | |
| 2006/0257672 A1 | * | 11/2006 | Horikoshi ............. | H05K 3/285 428/447 |
| 2009/0264612 A1 | | 10/2009 | Stanjek et al. | |
| 2020/0199302 A1 | | 6/2020 | Hirokami et al. | |

FOREIGN PATENT DOCUMENTS

| | | |
|---|---|---|
| JP | 2008-523177 A | 7/2008 |
| JP | 4114037 B2 | 7/2008 |
| JP | 4186071 B2 | 11/2008 |
| JP | 2017-48345 A | 3/2017 |
| JP | 2017-141467 A | 8/2017 |
| JP | 2018-199784 A | 12/2018 |

OTHER PUBLICATIONS

Cray Valley Technical Data Sheet, p. 2 (no date). (Year: 0).*
International Search Report, issued in PCT/JP2019/027272, dated Oct. 8, 2019.
Written Opinion of the International Searching Authority, issued in PCT/JP2019/027272, dated Oct. 8, 2019.

* cited by examiner

*Primary Examiner* — David J Buttner
*Assistant Examiner* — Surbhi M Du
(74) *Attorney, Agent, or Firm* — Birch, Stewart, Kolasch & Birch, LLP

(57) ABSTRACT

This room-temperature-curable polybutadiene resin composition contains:
(A) a urethane oligomer comprising a condensation polymer of (A1) a polybutadiene having an OH group at both ends of the molecular chain and (A2) a diisocyanate compound;
(B) a hydrolysable organosilane compound which, in one molecule, has on average two or more hydrolysable groups bonded to a silicon atom and does not have three or more nitrogen atoms, and/or a partially hydrolysed condensate of said compound;
(C) a condensation reaction catalyst; and
(D) a hydrolysable organosilane compound which, in one molecule, has three or more nitrogen atoms, and/or a partially hydrolysed condensate of said compound.
Said room-temperature-curable polybutadiene resin composition allows a coating film to be obtained, in particular a coating film that is resistant to gas permeation, said coating film therefore being useful as a coating material having properties preventing corrosion by a corrosive gas.

15 Claims, No Drawings

ROOM-TEMPERATURE-CURABLE POLYBUTADIENE RESIN COMPOSITION, METHOD FOR PRODUCING SAME, AND PACKAGED CIRCUIT BOARD

TECHNICAL FIELD

The present invention relates to a condensation-curable-type room-temperature-curable polybutadiene resin composition which can be formed into a coating film having gas resistance, specifically to a room-temperature-curable polybutadiene resin composition suited in the application as coating material compositions, especially as coating materials for substrates for electrical and electronic parts an on-board automotive part and sealing materials for liquid crystal display elements. More especially, it relates to a room-temperature-curable polybutadiene resin composition which can provide a cured coating film having corrosion protection performance against corrosive gases; a method for producing the composition; and a packaged circuit board having a cured coating film made from the composition.

BACKGROUND ART

A coating material for a region in the vicinity of a liquid crystal or for a power source circuit board is required to have a moisture-resistant property, a dust-proof property, and an electrical insulation property. Therefore, an alcohol-removed or acetone-removed room-temperature-vulcanizing (RTV) silicone rubber composition, a polyurethane resin, a polyolefin resin or the like has been generally used as the coating material. An RTV silicone rubber coating material satisfies the main purposes thereof, i.e., the insulation and the protection from moisture of an electric/electronic circuit, and can be applied to various types of substrate due to the handling easiness thereof. However, the RTV silicone rubber coating material has little corrosion protecting function for metals used in electronic parts, such as silver and copper. This is because an organopolysiloxane that is a raw material for the coating material has high gas permeability. Therefore, a gas having a small molecular weight, such as a sulfur-based corrosive gas, e.g., hydrogen sulfide, sulfur dioxide can pass through the coating material easily to form a metal sulfide. When the metal sulfide is once formed, an electrical connection is blocked, resulting in the loss of the properties an electric/electronic products.

In the past, as organopolysiloxane compositions imparted with resistance to sulfurization with a corrosive gas, particularly a sulfur-containing gas, the following compositions have been exemplified.

JP 4114037 (Patent Document 1) has proposed a silicone rubber composition for sealing electric/electronic parts, in which a metal powder that can be sulfurized with a sulfur-containing gas easily is added in an amount of 0.5 to 90% by weight to an organopolysiloxane composition. In Patent Document 1, it is described that the addition of a metal powder that can be sulfurized easily with a sulfur-containing gas is useful for the protection of an electric/electronic part from sulfurization. However, there is found no statement about the use of the composition for coating an electric/electronic part, and substantially only an addition-curable silicone rubber composition is described. Furthermore, when a metal powder is added to a coating material, the metal powder is settled easily and therefore the coating material is cumbersome to handle.

JP 4186071 (Patent Document 2) discloses a room-temperature-curable organopolysiloxane composition which is prepared by adding 0.1% by weight or more and less than 20% by weight of a metal powder, preferably a copper powder and/or a brass powder, capable of being sulfurized with sulfur and/or a sulfur gas to an organopolysiloxane composition. These metals have high reactivity with sulfur and/or a sulfur gas, and therefore can impart a sulfurization-resistant property to the room-temperature-curable organopolysiloxane composition when added in a small amount. The addition of these metals is suitable for an inorganic-filler-containing room-temperature-curable organopolysiloxane composition which is used as a sealing material for an automotive part, an adhesive agent for electric/electronic applications and the like. However, this technique is not suitable for a material having a low viscosity (e.g., a material for coating applications), because a metal powder may settle. In addition, the material is colored with the metal powder, and therefore it is difficult to prepare a coating material for which transparency is required. The metal powder can exert the sulfurization prevention effect thereof particularly by trapping the sulfur-containing gas. However, when the metal powder is consumed in the trapping of the sulfur-containing gas, the composition looses this function. Furthermore, this effect is particularly limited to the case of a sulfur-containing gas, and the barrier property against a nitrogen oxide gas is poor.

In these situations, the polyurethane resin, the polyolefin resin and the like mentioned above have been used as a common coating material having a function to protect a metal from corrosion. Most of these coating materials comprise vanish-based materials, and generally contain aromatic organic solvents at high contents. Among the organic solvents, an aromatic hydrocarbon such as benzene, toluene and xylene is not preferred because of its adverse effect on human bodies and environments.

PRIOR ART DOCUMENTS

Patent Documents

Patent Document 1: JP 4114037
Patent Document 2: JP 4186071

SUMMARY OF INVENTION

Technical Problem

An object of the invention, which has been made under the above-mentioned circumstances, is to provide: a room-temperature-curable polybutadiene resin composition which can provide a coating film, particularly a coating film having gas permeation resistance, a method for preparing the composition and a packaged circuit board having a cured coating film produced from the composition.

Solution to Problem

The present inventors have made intensive and extensive studies for the purpose of achieving the above-mentioned object. As a result, it is found that a condensation-curable-type room-temperature-curable polybutadiene resin composition can satisfy the above-mentioned requirement, which comprises:
(A) a urethane oligomer comprising a polycondensate of
(A1) a polybutadiene having OH groups respectively at both ends of the molecular chain thereof and (A2) a diisocyanate compound;

(B) a hydrolyzable organosilane compound having on the average at least 2 silicon-bonded hydrolyzable groups per molecule and not having 3 or more nitrogen atoms per molecule and/or a partial hydrolytic condensate thereof;
(C) a condensation reaction catalyst; and
(D) a hydrolyzable organosilane compound having 3 or more nitrogen atoms per molecule and/or a partial hydrolytic condensate thereof. This finding leads to the accomplishment of the present invention.

Therefore, the present invention provides a room-temperature-curable polybutadiene resin composition as mentioned below, a method for preparing the composition, and a packaged circuit board.

[1]
A room-temperature-curable polybutadiene resin composition comprising:
(A) a urethane oligomer comprising a polycondensate of (A1) a polybutadiene having OH groups respectively at both ends of the molecular chain thereof and (A2) a diisocyanate compound;
(B) a hydrolyzable organosilane compound having on the average at least 2 silicon-bonded hydrolyzable groups per molecule and not having 3 or more nitrogen atoms per molecule and/or a partial hydrolytic condensate thereof;
(C) a condensation reaction catalyst; and
(D) a hydrolyzable organosilane compound having 3 or more nitrogen atoms per molecule and/or a partial hydrolytic condensate thereof.

[2]
The room-temperature-curable polybutadiene resin composition according to [1], wherein, in the component (A), the ingredient (A1) is a polybutadiene having OH groups respectively at both ends of the molecular chain thereof which has the general formula (1), the ingredient (A2) is a diisocyanate compound having the general formula (2), and the polycondensate of the ingredients (A1) and (A2) is a urethane oligomer having the general formula (3):

[Chem. 1]

$$HO \left[ \left( \underset{a}{\diagdown\diagup} \right) \left( \underset{b}{\diagdown\diagup} \right) \left( \underset{c}{\diagdown\diagup} \right) \right]_n OH \quad (1)$$

wherein n represents an integer of 5 or more; each of a, b and c independently represents a positive number of 0.01 to 0.98, and a+b+c is 1;

$$O=C=N-A-N=C=O \quad (2)$$

wherein A represents a bivalent hydrocarbon group having 1 to 20 carbon atoms;

[Chem. 2]

$$HO \left[ PB-O-\underset{\parallel}{\overset{O}{C}}-\underset{H}{N}-A-\underset{H}{N}-\underset{\parallel}{\overset{O}{C}}-O \right]_m PB-OH \quad (3)$$

wherein PB represents a group having the following general formula:

[Chem. 3]

$$\left[ \left( \underset{a}{\diagdown\diagup} \right) \left( \underset{b}{\diagdown\diagup} \right) \left( \underset{c}{\diagdown\diagup} \right) \right]_n$$

wherein a, b, c, a+b+c and n are as defined above,
A is as defined above, and m represents an integer of 1 or more.

[3]
The room-temperature-curable polybutadiene resin composition according to [1] or [2], wherein the ingredient (A1) has a number average molecular weight of at least 1,000.

[4]
The room-temperature-curable polybutadiene resin composition according to any one of [1] to [3], wherein the component (D) is an amino-group-containing hydrolyzable organosilane compound having the general formula (4) or (5) and/or a partial hydrolytic condensate thereof:

$$Y=N-Z-SiR_3 \quad (4)$$

$$Y-NH-Z-SiR_3 \quad (5)$$

wherein Y represents a monovalent or bivalent hydrocarbon group having 1 to 15 carbon atoms which contains 2 or more nitrogen atoms in the structure thereof; Z represents an unsubstituted or substituted bivalent hydrocarbon group having 1 to 10 carbon atoms which may contain a hetero atom; and R represents at least one kind of monovalent group selected from a hydrolyzable group having 1 to 6 carbon atoms and a monovalent hydrocarbon group having 1 to 6 carbon atoms, provided that at least two of three Rs bonded to silicon atom are hydrolyzable groups.

[5]
The room-temperature-curable polybutadiene resin composition according to [4], wherein Y represents a group having the formula (6) or (7):

[Chem. 4]

(6)

[Chem. 5]

(7)

wherein each of $R^1$ to $R^4$ independently represents a hydrogen atom, a linear, branched or cyclic alkyl group having 1 to 10 carbon atoms, alkenyl group or aryl group, and a wavy line part represents a bonding part with nitrogen-atom.

[6]

The room-temperature-curable polybutadiene resin composition according to any one of [1] to [5], which is used in coating of electric and electronic parts and an on-board automotive part.

[7]

A method for preparing a room-temperature-curable polybutadiene resin composition, comprising:
effecting condensation reaction by mixing
(A1) 100 parts by weight of a polybutadiene having OH groups respectively at both ends of the molecular chain thereof,
(A2) a diisocyanate compound in an amount of 0.5 to 4.0 mol equivalents in terms of the content of isocyanate groups per 1 mol of hydroxyl groups in the ingredient (A1), and
(C) 0.001 to 10 parts by weight of a condensation reaction catalyst,
to prepare a urethane oligomer (A) comprising a polycondensate of the ingredients (A1) and (A2); and
then adding thereto the following
(B) 0.5 to 20 parts by weight of a hydrolyzable organosilane compound having on the average at least 2 silicon-bonded hydrolyzable groups per molecule and not having 3 or more nitrogen atoms per molecule and/or a partial hydrolytic condensate thereof, and
(D) 0.1 to 3 parts by weight of a hydrolyzable organosilane compound having 3 or more nitrogen atoms per molecule and/or a partial hydrolytic condensate thereof, and mixing the components uniformly.

[8]

A packaged circuit board comprising a circuit board having an electrical or electronic part mounted thereon and a cured coating thereon, the cured coating being a cured product of the room-temperature-curable polybutadiene resin composition of any one of [1] to [6].

Advantageous Effects of Invention

The room-temperature-curable polybutadiene resin composition of the present invention is suitable as a coating material, particularly a coating material for electric and electronic parts and substrates thereof, a coating material for an on-board automotive part, a sealing material for a liquid display element and the like. In particular, a (cured) coating film having gas permeation resistance is obtained, and the composition is thus useful as a coating material having a corrosion-preventing function against corrosive gases.

DESCRIPTION OF EMBODIMENTS

Hereinbelow, the present invention is described in detail.

[Component (A)]

The room-temperature-curable polybutadiene resin composition of the present invention is characterized by comprising a urethane oligomer (A), as a principal component (i.e., a base polymer), which comprises a polycondensate of a polybutadiene having OH groups respectively at both ends of the molecular chain thereof as an ingredient (A1) and a diisocyanate compound as an ingredient (A2).

[Ingredient (A1)]

As the ingredient (A1), i.e., the polybutadiene having OH groups respectively at both ends of the molecular chain thereof (which is also referred to as a "both-end-OH-group-containing polybutadiene", hereinafter) which is one of the raw materials for the urethane oligomer, a polybutadiene having the general formula (1) can be used suitably.

[Chem. 6]

$$HO{-}{\left[{\left({-}{-}\right)}_a{\left({-}{-}\right)}_b{\left({-}{-}\right)}_c\right]}_n{-}OH \quad (1)$$

wherein n represents an integer of 5 or more, preferably an integer of 5 to 500, more preferably an integer of 10 to 150, still more preferably an integer of 18 to 50, each of a, b and c independently represents a positive number of 0.01 to 0.98, and a+b+c is 1.

In formula (1), a, b and c satisfy the requirement having the equation of: a+b+c=1, wherein each of a, b and c may be an arbitrary numerical value. Provided that each of a, b and c independently represents a positive number of 0.01 to 0.98, and it is preferred that a represents a positive number of 0.01 to 0.3, b represents a positive number of 0.1 to 0.7 and c represents a positive number of 0.01 to 0.2.

The number average molecular weight (Mn) of the polybutadiene is preferably at least 300, more preferably at least 500, still more preferably at least 900. If Mn is less than 300, the room-temperature-curable polybutadiene resin composition may sometimes fail to be sufficiently rubber physical properties. While the upper limit of Mn is not particularly limited, Mn is typically about 30,000 or less, preferably about 8,000 or less, more preferably about 3,000 or less. The molecular weight (or polymerization degree) can be generally determined as, for example, a number average molecular weight (or a number average polymerization degree) in terms of polystyrene in a gel permeation chromatography (GPC) using toluene, tetrahydrofuran (THF), chloroform or the like as a developing solvent.

[Ingredient (A2)]

The diisocyanate compound of the ingredient (A2) is the other of the raw materials for the production of a urethane oligomer (A) or a polycondensate of a polybutadiene having OH groups respectively at both ends of the molecular chain thereof and a diisocyanate compound, as the principal component (base polymer) of the room-temperature-curable polybutadiene resin composition of the present invention. Specifically, the diisocyanate compound plays the role of a binder (a chain-extending agent) for oligomerizing by extending the chains of the polybutadiene of the ingredient (A1) through the condensation reaction (urethanization reaction) between an OH group in the both-end-OH-group-containing polybutadiene of the ingredient (A1) and an isocyanate group in the diisocyanate compound of the ingredient (A2) in the presence of a catalyst for condensation reaction. Therefore, the diisocyanate compound is an important component for imparting an adhesive property and a good rubber property.

As the diisocyanate compound of the ingredient (A2), a compound having a structure of general formula (2) can be used:

$$O{=}C{=}N{-}A{-}N{=}C{=}O \quad (2)$$

wherein A represents a bivalent hydrocarbon group having 1 to 20 carbon atoms.

In formula (2), examples of the bivalent hydrocarbon group having 1 to 20 carbon atoms of the radical A include alkylene groups such as methylene, ethylene, propylene, tetramethylene, hexamethylene, octamethylene, decamethylene, 2-methylpropylene and cyclohexylene; arylene groups such as phenylene, tolylene, naphthylene and diphenylmethylene; and a group that the alkylene group and the arylene group are bonded, or the like. A is preferably an alkylene group having 1 to 15 carbon atoms.

Examples of the ingredient (A2) include tolylene diisocyanate (TDI), 4,4'-diphenylmethane diisocyanate (MDI), 1,5-naphthalene diisocyanate (NDI), 1,4-phenylene diisocyanate (PPDI), 1,6-hexamethylene diisocyanate (HDI), 4,4'-dicyclohexylmethane diisocyanate ($H_{12}MDI$), isophorone diisocyanate (IPDI) and 1,4-cyclohexane diisocyanate (CHDI). Among these compounds, TDI and MDI are preferred.

The amount of the ingredient (A2) blended is 0.5 to 4.0 mol equivalents, preferably 0.5 to 3.5 mol equivalents, more preferably 0.5 to 2.5 mol equivalents, in terms of the content of isocyanate groups per 1 mol of hydroxyl groups in the ingredient (A1). If the amount is less than 0.5 mol equivalent, the viscosity of a composition containing the urethane oligomer (A) may increase. As a result, the composition may become unsuitable for coating use. If the compounding amount is more than 4.0 mol equivalents, disadvantages in costs may be brought, which is not preferred.

As the condensation reaction catalyst to be used in the condensation reaction of the ingredient (A1) and the ingredient (A2), a substance that is the same as the below-mentioned component (C) can be used. Examples of the condensation reaction catalyst include: organic carboxylic acid salts or alkoxides of metals such as tin, titanium, zirconium, iron, antimony, bismuth and manganese; an organic titanic acid ester; and an organic titanium chelate compound. Specific examples of the condensation reaction catalyst include: tin compounds such as dibutyltin dilaurate, dibutyltin octoate, dioctyltin dilaurate, dibutyl maleate ester, dimethyltin dineodecanoate, dibutyltin dimethoxide, dioctyltin dineodecanoate and stannous octoate; and titanium compounds such as tetrabutyl titanate, titanium diisopropoxybis(acetylacetonate) and diisopropoxybis(ethyl acetoacetate). Among these compounds, it is preferred to add organic tin compounds, particularly preferably a dialkyltin dialkoxide or a dialkyltin dicarboxylate.

The amount of the condensation reaction catalyst to be used is 0.001 to 10 parts by weight, preferably 0.005 to 5 parts by weight, particularly preferably 0.01 to 2 parts by weight, per 100 parts by weight of the ingredient (A1). If the amount is less than 0.001 part by weight, the reactivity of the polycondensation may become poor. As a result, it may become impossible to obtain the desired urethane oligomer. If the amount is more than 10 parts by weight, sufficient reactivity can be achieved. However, this amount is not preferred from the viewpoint of cost.

In the condensation reaction of the ingredient (A1) and the ingredient (A2), a solvent such as a saturated aliphatic hydrocarbon (e.g., low-boiling-point isoparaffin, n-hexane) and a cyclic aliphatic hydrocarbon (e.g., cyclohexane) may be used. In this case, the amount of the solvent to be used is not particularly limited, and is preferably 10 to 100 parts by weight per 100 parts by weight of the ingredient (A1).

With respect to the conditions for the condensation reaction of the ingredient (A1) and the ingredient (A2), it is preferred to carry out the reaction at 10 to 50° C., particularly preferably room temperature (23° C.), for 0.5 to 5 hours, particularly preferably 1 to 2 hours.

After the completion of the reaction, an unreacted component, the solvent or the like can be removed by a known method such as filtration and/or distillation under a reduced pressure.

In the present invention, the unreacted component, the solvent and the like may also be used without being removed. In this case, in the preparation of the room-temperature-curable polybutadiene resin composition, it may be possible to firstly carry out a condensation reaction of the ingredient (A1) and the ingredient (A2) in the presence of the below-mentioned component (C) (condensation reaction catalyst) to prepare the component (A), and subsequently add the below-mentioned components (B) and (D) to the resultant reaction mixture to prepare the room-temperature-curable polybutadiene resin composition.

The urethane oligomer (A) comprising a polycondensate of the ingredient (A1) and the ingredient (A2), which is produced in this manner, is preferably a urethane oligomer having general formula (3).

[Chem. 7]

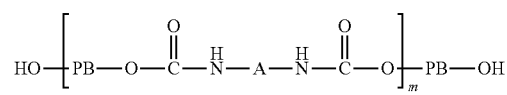

(3)

wherein PB represents a group having the general formula:

[Chem. 8]

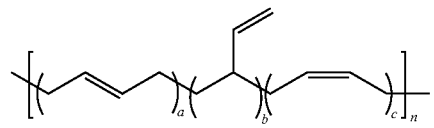

wherein a, b, c, a+b+c and n are as defined above;
A is as defined above; and m represents an integer of 1 or more, preferably an integer of 1 to 10.

[Component (B)]

The component (B) is at least one compound selected from the groups consisting of a hydrolyzable organosilane compound having on the average at least 2, preferably 3 or 4, silicon-bonded hydrolyzable groups (i.e., hydrolyzable groups each bound to a silicon atom) per molecule and not having 3 or more nitrogen atoms per molecule and/or a partial hydrolytic condensate thereof. The component (B) can act as a crosslinking agent (a curing agent) for the room-temperature-curable polybutadiene resin composition of the present invention.

The term "partial hydrolytic condensate" as used herein refers to an organosilane oligomer which can be produced by partially hydrolyzing/condensing a hydrolyzable organosilane compound, and which has 2 or more, preferably 3 or more, remaining hydrolyzable groups in the molecule thereof.

The hydrolyzable organosilane compound and/or the partial hydrolytic condensate thereof of the component (B) is clearly distinguished from the below-mentioned component (D) with respect to the point of not having 3 or more nitrogen atoms per molecule.

Examples of the component (B) include various types of silanes, including: tetraalkoxysilanes or partial hydrolytic condensate thereof such as tetraethoxysilane, tetramethoxysilane, ethyl silicate and methyl silicate; ketoximesilanes such as methyltris(dimethylketoxime)silane, methyltris(methylethylketoxime)silane, ethyltris(methylethylketoxime)silane, methyltris(methylisobutylketoxime)silane and vinyltris(methylethylketoxime)silane; organoalkoxysilanes such as methyltrimethoxysilane, vinyltrimethoxysilane, phenyltrimethoxysilane, methyltriethoxysilane, vinyltriethoxysilane, n-propyltrimethoxysilane, n-hexyltrimethoxysilane, n-decyltrimethoxysilane, 1,6-bistrimethoxysilylhexane, dimethyldimethoxysilane, vinyldimethoxymethylsilane and dimethyldiethoxysilane; alkenoxysilanes such as methyltriisopropenoxysilane, vinyltriisopropenoxysilane and phenyltriisopropenoxysilane; acetoxysilanes such as methyltriacetoxysilane, ethyltriacetoxysilane and vinyltriacetoxysilane; and hydrolytic condensates of one or more of the aforementioned compounds. As the component (B), alkoxysilanes and alkenoxysilanes are preferred, and alkenoxysilanes are particularly preferred.

The amount of the component (B) blended is preferably 0.5 to 20 parts by weight, particularly preferably 1 to 10 parts by weight, per 100 parts by weight of the ingredient (A1). If the amount is less than 0.5 part by weight, it may be difficult to obtain a cured product having a desired level of rubbery elasticity. If the amount is more than 20 parts by weight, disadvantages in costs may be brought and the workability may become poor due to the prolongation of a coating film drying time or the like. The amount of the component (B) in the case of being compounded with the components (A), (C) and (D) is preferably 0.5 to 20 parts by weight, particularly preferably 1 to 10 parts by weight, per 100 parts by weight of the component (A).

[Component (C)]

The component (C) or a curing catalyst (a condensation reaction catalyst) can act to promote the condensation reaction for the preparation of the urethane oligomer (A) comprising a polycondensate of the ingredients (A1) and (A2), and can also act to promote the condensation reaction of the component (A) and the component (B) and/or the below-mentioned component (D). The component (C) for promoting the condensation reaction of the ingredients (A1) and (A2) may be the same as or different from the component (C) for promoting the condensation reaction of the component (A) and the component (B) and/or the below-mentioned component (D). The component (C) may be used alone or as a mixture of two or more.

As mentioned above, in the preparation of the urethane oligomer (A) comprising a polycondensate of (A1) a polybutadiene which contains the OH groups respectively at both ends of the molecular chain thereof and (A2) a diisocyanate compound, the condensation reaction catalyst of the component (C) acts as a catalyst for promoting the condensation reaction (urethanization reaction) of OH groups in the both-end-OH-group-containing polybutadiene of the ingredient (A1) and an isocyanate group in the diisocyanate compound of the ingredient (A2). Examples of the condensation reaction catalyst include organic carboxylic acid salts or alkoxides of metals such as tin, titanium, zirconium, iron, antimony, bismuth and manganese; organic titanic acid esters; and organic titanium chelate compounds. Specific examples of the condensation reaction catalyst include: tin compounds such as dibutyltin dilaurate, dibutyltin octoate, dioctyltin dilaurate, dibutyl maleate ester, dimethyltin dinedodecanoate, dibutyltin dimethoxide, dioctyltin dineodecanoate and stannous octoate; and titanium compounds such as tetrabutyl titanate, titanium diisopropoxibis(acetylacetonate) and diisopropoxibis(ethyl acetoacetate). Among these compounds, it is preferred to add organic tin compounds, particularly preferably dialkyltin dialkoxides or dialkyltin dicarboxylates.

In the case where the component (C) is used for both of the condensation reaction of the ingredients (A1) and (A2) and the condensation reaction of the component (A) and the component (B) and/or the below-mentioned component (D), the amount of the component (C) to be added is 0.001 to 10 parts by weight, preferably 0.005 to 5 parts by weight, particularly preferably 0.005 to 1 part by weight, per 100 parts by weight of the ingredient (A1). If the amount is less than 0.001 part by weight, the desired properties may not be achieved. If the amount is more than 10 parts by weight, disadvantages in costs may be brought, or another disadvantages including the slowing down of the curing speed may also be brought. The amount of the component (C) in the case of being compounded with the components (A), (B) and (D) is preferably 0.005 to 5 parts by weight, particularly preferably 0.01 to 3 parts by weight, per 100 parts by weight of the component (A).

[Component (D)]

The component (D) is an important component for exhibiting the adhesive property and curability of the room-temperature-curable polybutadiene resin composition of the present invention. More specifically, the component (D) is a hydrolyzable organosilane compound having 3 or more nitrogen atoms, preferably 3 to 6 nitrogen atoms, more preferably 3 to 5 nitrogen atoms per one molecule, and preferably having 2 or more hydrolyzable groups binding to silicon atom per one molecule and/or a partial hydrolytic condensate thereof, other than the above-mentioned component (B). Particularly, the component (D) is an amino-group-containing hydrolyzable organosilane compound having a monovalent or bivalent basic moiety (Y) capable of exerting a catalytic function which is represented by the general formula (4) or (5) and/or a partial hydrolytic condensate thereof.

(4)

(5)

In this case, in general formula (4) or (5), the monovalent or bivalent basic moiety Y represents a monovalent or bivalent hydrocarbon group having 1 to 15 carbon atoms and having 2 or more nitrogen atoms, preferably 2 to 5 nitrogen atoms, more preferably 2 to 4 nitrogen atoms in the structure thereof. An example of the monovalent basic moiety Y is a group composed of a partial structure of 1,5,7-triazabicyclo[4.4.0]dec-5-ene, which has the formula (6). An example of the bivalent basic moiety Y is a strongly basic group such as an N-substituted or unsubstituted guanidyl group which has formula (7). In each of the formulae shown below, a wavy line part represents a bonding part with nitrogen-atom.

[Chem. 9]

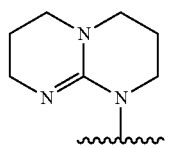

(6)

[Chem. 10]

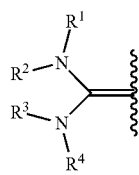
(7)

In formula (7), each of $R^1$ to $R^4$ independently represents a hydrogen atom, a linear, branched or cyclic alkyl group having 1 to 10 carbon atoms, alkenyl group or aryl group, such as alkyl groups (e.g., methyl, ethyl, propyl), cyclic alkyl groups (e.g., cyclohexyl), alkenyl groups (e.g., vinyl, allyl), and aryl groups (e.g., phenyl, tolyl). Among these radicals, methyl, ethyl and phenyl are preferred, and methyl is particularly preferred. $R^1$ to $R^4$ may be the same as or different from one another.

In formula (4) or (5), R independently represents at least one kind of monovalent group selected from a hydrolyzable group having 1 to 6 carbon atoms, preferably 1 to 4 carbon atoms (i.e., a group capable of binding to a silicon atom to form an Si—O—C bond), such as alkoxy groups (e.g., methoxy, ethoxy, propoxy, isopropoxy, butoxy, isobutoxy, tert-butoxy), alkenyloxy groups (e.g., vinyloxy, allyloxy, propenoxy, isopropenoxy), ketoxime groups (e.g., dimethylketoxime, diethylketoxime, methylethylketoxime) and acyloxy groups (e.g., acetoxy) and a monovalent hydrocarbon group having 1 to 6 carbon atoms, preferably 1 to 4 carbon atoms, such as alkyl groups (e.g., methyl, ethyl), alkenyl groups (e.g., vinyl) and aryl groups (e.g., phenyl). Proviso that among three Rs bonded to silicon atom, at least two, preferably three of the Rs are hydrolyzable groups.

Examples of the hydrolyzable silyl group (—SiR₃) include alkoxysilyl groups such as trimethoxysilyl, methyldimethoxysilyl, vinyldimethoxysilyl, phenyldimethoxysilyl and triethoxysilyl; isopropenoxysilyl groups such as triisopropenoxysilyl, methyldiisopropenoxysilyl, ethyldiisopropenoxysilyl, vinyldiisopropenoxysilyl and phenyldiisopropenoxysilyl; and ketoximesilyl groups such as tris (dimethylketoxime)silyl, tris(diethylketoxime)silyl and tris (ethylmethylketoxime)silyl.

In formula (4) or (5), Z represents an unsubstituted or substituted bivalent hydrocarbon group having 1 to 10 carbon atoms, preferably 1 to 6 carbon atoms, more preferably 2 to 4 carbon atoms which may contain a hetero atom such as an oxygen atom or a nitrogen atom, typically a straight, branched or cyclic alkylene group, alkenylene group, or arylene group, or a combination thereof. Examples include alkylene groups such as methylene, ethylene, propylene, tetramethylene, hexamethylene, octamethylene, decamethylene and 2-methylpropylene; arylene groups such as phenylene; combinations of such an alkylene group with an arylene group, and the foregoing alkylene groups separated by ketone, ester or amide. Of these, methylene, ethylene, propylene, and propylene separated by an amide bond are preferred, with propylene being most preferred.

Examples of the amino-group-containing hydrolyzable organosilane compound having general formula (4) or (5) include the compounds having general formulae (8) to (13) shown below. Notably, Me stands for methyl, Et for ethyl, and Ph for phenyl.

[Chem. 11]

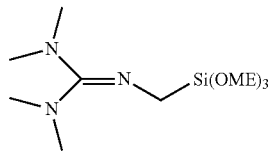
(8)

[Chem. 12]

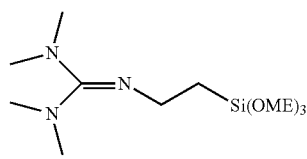
(9)

[Chem. 13]

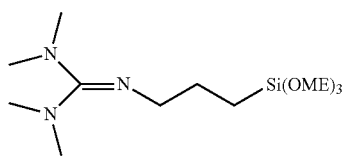
(10)

[Chem. 14]

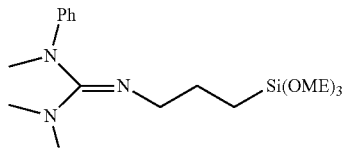
(11)

[Chem. 15]

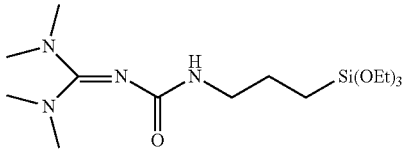
(12)

[Chem. 16]

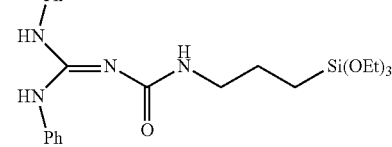
(13)

Among of these, preference is given to N-methyl-substituted guanidyl-group-containing trialkoxysilanes, specifically N-methyl-substituted guanidyl-containing trimethoxysilanes having formulae (8), (9) and (10), more specifically γ-(N,N'-dimethylguanidyl)propyltrimethoxysilane (i.e., N,N,N',N'-tetramethyl-N"-[3-(trimethoxysilyl)propyl]guanidine)) having formula (10).

The amount of the component (D) blended is generally 0.1 to 3 parts by weight, preferably 0.1 to 2 parts by weight, more preferably 0.15 to 1.5 parts by weight, per 100 parts by weight of the ingredient (A1). If the amount is less than 0.1 part by weight, the desired composition may not be obtained. If the amount is more than 3 parts by weight, disadvantages in costs may be brought, which is not preferred. The amount of the component (D) to be compounded with the components (A), (B) and (C) is preferably 0.1 to 3 parts by weight, particularly preferably 0.1 to 2 parts by weight, per 100 parts by weight of the component (A).

[Other Components]

In addition to the above-mentioned components, a filler, an additive and the like may also be compounded, as long as the properties as a coating material cannot be deteriorated.

Examples of the filler include pulverized silica, fumed silica, calcium carbonate, zinc carbonate, aluminum hydroxide, aluminum hydroxide oxide, alumina, magnesium oxide and wet silica.

Examples of the additive include a polyether which acts as a wetter or a thixotropy improver and a plasticizer-unreactive dimethylsilicone oil.

If necessary, a coloring agent (e.g., a pigment, a dye), a fluorescent brightening agent, an antifungal agent, an antibacterial agent, a surface modifier (e.g., an organic liquid), a solvent for viscosity modification purposes (e.g., a solvent volatile oil, cyclohexane, methylcyclohexane, low-boiling-point isoparaffin) may be added. In the case where a compound for viscosity modification purposes is to be added, it is effective to use a compound having a kinematic viscosity of about 0.1 to 50 $mm^2/s$ at 25° C.

The room-temperature-curable polybutadiene resin composition of the present invention can be prepared by mixing specified amounts of the above-mentioned components (A) to (D) and optionally specified amounts of the above-mentioned additional components together uniformly under a dry atmosphere.

In the present invention, it is possible to prepare the component (A) in advance as a preparative step during the production (in the middle of the production) of the room-temperature-curable polybutadiene resin composition, as mentioned above. In this case, the component (C) acts for both of the promotion of the condensation reaction of the ingredients (A1) and (A2) and the promotion of the condensation reaction of the component (A) and the component (B) or the component (D). In a specific example of the preparation method of this type, the room-temperature-curable polybutadiene resin composition can be prepared by: effecting a condensation reaction of the ingredients (A1) and (A2), which are raw materials for the component (A), in the presence of the component (C) that is a condensation reaction catalyst to prepare the component (A); then adding the components (B) and (D) thereto; and then mixing the components uniformly.

From the viewpoint of, for example, workability when used as a coating material, it is preferred that the room-temperature-curable polybutadiene resin composition of the present invention has a viscosity of 100 to 3,000 mPa·s, particularly preferably 200 to 2,000 mPa·s, still more preferably 300 to 1,500 mPa·s, as measured at 25° C. with a rotary viscometer.

The room-temperature-curable polybutadiene resin composition thus produced can be cured by allowing the composition to leave at room temperature (23° C.). With respect to the method for shaping the cured product, the conditions for the curing and the like, a known method and known conditions may be employed depending on the types of the composition.

The room-temperature-curable polybutadiene resin composition of the present invention is useful as a coating material or a sealing material. In particular, the room-temperature-curable polybutadiene resin composition is suitable as a coating material for electric and electronic parts, a substrate for the electric and electronic parts and the like, a coating material for an on-board automotive part, a sealing material for a liquid crystal display element, and the like. The room-temperature-curable polybutadiene resin composition of the present invention can provide a cured product having gas permeation resistance, and therefore is useful as a coating or sealing material capable of preventing the invasion of a corrosive gas (e.g., a hydrogen sulfide gas, a sulfur dioxide gas) and capable of imparting corrosion protection performance to a substrate. A specific example is a packaged circuit board comprising: a circuit board which has electric and electronic parts mounted thereon; and a cured coating film which comprises a cured product of the room-temperature-curable polybutadiene resin composition and is formed on the circuit board.

In the case where the room-temperature-curable polybutadiene resin composition of the present invention is used as a coating material, the coating method can be achieved by brush coating, dip coating, spray coating or the like. The coated composition is cured under the conditions of, for example, 23° C./50% RH so as to achieve a desired thickness. In this manner, a cured product (a cured coating film) can be produced.

In the case where the room-temperature-curable polybutadiene resin composition of the present invention is used as a coating material, the thickness of the cured coating film is not particularly limited, and is preferably 10 to 2,000 μm, particularly preferably 20 to 1,000 μm.

EXAMPLES

Examples of the invention and Comparative Examples are given below by way of illustration, but not by way of limitation. In Examples, the viscosity was measured at 25° C. using a rotary viscometer.

Example 1

By adding and mixing 100 parts by weight of Krasol LBH-P2000 (produced by Cray Valley) (in the formula (1), a=0.225, b=0.65, c=0.125, Mn=2,000, OH group content: 0.001 mol/g) which served as the ingredient (A1), 42.5 parts by weight of ISOPAR E (isoparaffin hydrocarbon; produced by Exxon Mobil), 0.025 part by weight of dibutyltin dilaurate which served as the component (C), and tolylene diisocyanate which served as the ingredient (A2) in such an amount (7.95 parts by weight) that the isocyanate group amount became 1.0 mol equivalent per 1 mol of OH groups in the ingredient (A1), at room temperature (23° C., the same applied hereinafter) for 60 minutes, Urethane oligomer 1 as an intermediate was prepared. To the intermediate (Urethane oligomer 1) prepared, 10 parts by weight of vinyltriisopropenoxysilane which served as the component (B) and 1 part by weight of amino-group-containing hydrolyzable organosilane having formula (10) (γ-(N,N'-dimethylguanidyl) propyltrimethoxysilane or N,N,N',N'-tetramethyl-N"-[3-(trimethoxysilyl)propyl]guanidine) which served as the component (D) were added and mixed at room temperature for 15 minutes, obtaining Composition 1.

Example 2

To 108 parts by weight of Urethane oligomer 1 which had been prepared in the same manner as in Example 1, 10 parts by weight of vinyltriisopropenoxysilane which served as the component (B) and 0.5 part by weight of the amino-group-containing hydrolyzable organosilane having formula (10)

which served as the component (D) were added and mixed at room temperature for 15 minutes, obtaining Composition 2.

Example 3

To 108 parts by weight of Urethane oligomer 1 which had been prepared in the same manner as in Example 1, 10 parts by weight of vinyltriisopropenoxysilane which served as the component (B) and 0.15 part by weight of the amino-group-containing hydrolyzable organosilane having formula (10) which served as the component (D) were added and mixed at room temperature for 15 minutes, obtaining Composition 3.

Example 4

To 108 parts by weight of Urethane oligomer 1 which had been prepared in the same manner as in Example 1, 10 parts by weight of phenyltriisopropenoxysilane which served as the component (B) and 0.5 part by weight of the amino-group-containing hydrolyzable organosilane having formula (10) which served as the component (D) were added and mixed at room temperature for 15 minutes, obtaining Composition 4.

Example 5

By adding and mixing 100 parts by weight of Krasol LBH-P2000 (produced by Cray Valley) which served as the ingredient (A1), 42.5 parts by weight of ISOPAR E (produced by Exxon Mobil), 0.025 part by weight of dibutyltin dilaurate which served as the component (C), and tolylene diisocyanate which served as the ingredient (A2) in such an amount (6.36 parts by weight) that the isocyanate group amount became 0.8 mol equivalent per 1 mol of OH groups in the ingredient (A1), at room temperature for 60 minutes, Urethane oligomer 2 as an intermediate was prepared. To the intermediate (Urethane oligomer 2) prepared, 10 parts by weight of vinyltriisopropenoxysilane which served as the component (B) and 1 part by weight of amino-group-containing hydrolyzable organosilane having formula (10) which served as the component (D) were added and mixed at room temperature for 15 minutes, obtaining Composition 5.

Comparative Example 1

100 parts by weight of Krasol LBH-P2000 (produced by Cray Valley) which served as the ingredient (A1), 42.5 parts by weight of ISOPAR E (produced by Exxon Mobil), and tolylene diisocyanate which served as the ingredient (A2) in such an amount (7.95 parts by weight) that the isocyanate group amount became 1.0 mol equivalent per 1 mol of OH groups in the ingredient (A1) were added and mixed at room temperature for 60 minutes. Subsequently, 10 parts by weight of vinyltriisopropenoxysilane which served as the component (B) and 1 part by weight of the amino-group-containing hydrolyzable organosilane having formula (10) which served as the component (D) were added to the mixture and mixed at room temperature for 15 minutes, obtaining Composition 6.

Comparative Example 2

100 parts by weight of Krasol LBH-P2000 (produced by Cray Valley) which served as the ingredient (A1), 42.5 parts by weight of ISOPAR E (produced by Exxon Mobil), and 0.025 part by weight of dibutyltin dilaurate which served as the component (C) were mixed at room temperature for 60 minutes. Subsequently, 10 parts by weight of vinyltriisopropenoxysilane which served as the component (B) and 1 part by weight of the amino-group-containing hydrolyzable organosilane having formula (10) which served as the component (D) were added to the mixture and mixed at room temperature for 15 minutes, obtaining Composition 7.

Comparative Example 3

The same procedure as in Example 1 was carried out except that as the ingredient (A1), 100 parts by weight of polydimethylsiloxan having silanol groups respectively at both ends of the molecular chain thereof and having a viscosity of 700 mPa·s at 25° C. was used instead of Krasol LBH-P2000 (produced by Cray Valley), obtaining Composition 8.

Urethane Oligomers 1 and 2

Urethane oligomers 1 and 2 prepared above were confirmed to be respectively a tetramer and a dimer of LBH-P2000s linked via tolylene diisocyanate by gel permeation chromatography (GPC) analysis.

[Evaluation Methods]

The following tests were carried out using the above-prepared Compositions 1 to 8. The results are shown in Tables 1 to 4.

Viscosities and Physical Properties of Cured Products

Each of Compositions 1 to 8 was applied onto a polytetrafluoroethylene resin substrate at a thickness of 2.0 to 2.5 mm, and was then cured under the conditions of 23° C./50% RH for 7 days. In this manner, specimens were produced. Each of the cured products was measured with respect to hardness, elongation at break and tensile strength in accordance with JIS K 6249.

In addition, in order to confirm the adhesive property to a substrate Fr-4 (Flame Retardant Type 4), the evaluation was carried out in accordance with JIS K 5600-5-6 by a cross cut method at an application thickness of 200 μm. The criteria of the cross cut test are as follows.

In 25 grid patterns (25 squares) formed on the coating film, the number of squares in which peeling or chipping was observed was counted.

Water Vapor Permeability

Each of Compositions 1 to 8 was applied onto a polytetrafluoroethylene resin substrate at a thickness of 250 μm, and was then cured under the conditions of 23° C./50% RH for 4 days. In this manner, specimens (i.e., thin films of cured products of Compositions 1 to 8 having a thickness of 250 μm) were produced. The water vapor permeability of each of the specimens was measured at room temperature with L80-5000 (SYSTECH Instruments), and the numerical value obtained 1 hour after the start of the measurement was recorded. The water vapor permeability was measured as the standard or index for the permeability of a corrosive gas.

Barrier Property Against Corrosive Gas

Each of Compositions 1 to 8 was applied onto a silver-plated nickel substrate having a size of 25 mm×50 mm×0.2 mm (t) at a thickness of 300 μm, and was then cured under the conditions of 23° C./50% RH for 4 days. In this manner, specimens were produced.

Each of the specimens was exposed to an atmosphere (23° C.) of hydrogen sulfide with a concentration of 10 ppm using a constant flow rate type gas corrosion test apparatus (Yamazaki Seiki Institute), and the change in the level of corrosion on a silver surface over time was confirmed with visual observation. The criteria of the evaluation are as follows.

○: Corrosion was not observed on the silver surface.
Δ: The silver surface was partially corroded.
X: The silver surface was wholly corroded.

[Measurement Results]

Viscosities and Physical Properties of Cured Products, and Water Vapor Permeability

TABLE 1

|  | Example 1 Composition 1 | Example 2 Composition 2 | Example 3 Composition 3 | Example 4 Composition 4 | Example 5 Composition 5 |
|---|---|---|---|---|---|
| Viscosity (mPa · s) | 1,150 | 1,080 | 936 | 1,190 | 480 |
| Hardness (Duro. A) | 51 | 51 | 52 | 48 | 40 |
| Elongation at break (%) | 250 | 200 | 230 | 190 | 1,270 |
| Tensile strength (MPa) | 2.6 | 2.3 | 2.1 | 2.0 | 1.6 |
| Water vapor permeability (g/m² · day) | 36 | 34 | 35 | 35 | 38 |
| Cross cut test (squares) | 0 | 0 | 0 | 0 | 0 |

TABLE 2

|  | Comparative Example 1 Composition 6 | Comparative Example 2 Composition 7 | Comparative Example 3 Composition 8 |
|---|---|---|---|
| Viscosity (mPa · s) | 3,630 | *1 | 920 |
| Hardness (Duro. A) | Many air bubbles were observed in specimen | Uncured | 22 |
| Elongation at break (%) |  |  | 90 |
| Tensile strength (MPa) | N.D. |  | 0.4 |
| Water vapor permeability (g/m² · day) |  |  | 120 |
| Cross cut test (squares) | N.D. | N.D. | 25 |

*1 The measurement was impossible, because being cured in test container

In Examples 1 to 5, it was found that the Compositions had small viscosities, high hardness, high elongation, high adhesion properties, and small water vapor permeability. It was demonstrated that the Compositions were suitable as substrate coating materials. Meanwhile, in Comparative Examples 1 to 3, the Compositions were poor in shapability and curability and had small hardness. In Comparative Example 3, the water vapor permeability was high and it was assumed that the gas barrier property was poor.

Barrier Property Against Corrosive Gas

TABLE 3

|  | Example 1 Composition 1 | Example 2 Composition 2 | Example 3 Composition 3 | Example 4 Composition 4 | Example 5 Composition 5 |
|---|---|---|---|---|---|
| After 1 day | ○ | ○ | ○ | ○ | ○ |
| After 2 days | ○ | ○ | ○ | ○ | ○ |
| After 3 days | ○ | ○ | ○ | ○ | ○ |
| After 5 days | ○ | ○ | ○ | ○ | ○ |
| After 7 days | ○ | ○ | ○ | ○ | ○ |

TABLE 4

|  | Comparative Example 1 Composition 6 | Comparative Example 2 Composition 7 | Comparative Example 3 Composition 8 |
|---|---|---|---|
| After 1 day | ○ | N.D. | Δ |
| After 2 days | Δ |  | X |
| After 3 days | Δ |  | X |
| After 5 days | X |  | X |
| After 7 days | X |  | X |

In Examples 1 to 5, the corrosion of the silver surface was not observed and therefore the gas resistance was good in each of the specimens. Meanwhile, in Comparative Example 1, many air bubbles were observed in the specimen, and therefore the gas resistance was poor. In Comparative Example 3, it was assumed that the composition had a high gas permeability, and therefore the gas barrier property was very poor and the occurrence of the corrosion of the silver surface was confirmed within just one day.

The invention claimed is:

1. A room-temperature-curable polybutadiene resin composition comprising:

(A) a urethane oligomer having OH groups respectively at both ends of the molecular chain thereof comprising a polycondensate of (A1) a polybutadiene having OH groups respectively at both ends of the molecular chain thereof and (A2) a diisocyanate compound;

(B) a hydrolyzable organosilane compound having on the average at least 2 silicon-bonded hydrolyzable groups per molecule and not having 3 or more nitrogen atoms per molecule and/or a partial hydrolytic condensate thereof, wherein the hydrolyzable organosilane compound is a tetraalkoxysilane, ketoximesilane, organoalkoxysilane, alkenoxysilane, or acetoxysilane, wherein the organoalkoxysilane is methyltrimethoxysilane, vinyltrimethoxysilane, phenyltrimethoxysilane, methyltriethoxysilane, vinyltriethoxysilane, n-propyltrimethoxysilane, n-hexyltrimethoxysilane, n-decyltrimethoxysilane, 1,6-bistrimethoxysilylhexane, dimethyldimethoxysilane, vinyldimethoxymethylsilane or dimethyldiethoxysilane;

(C) a condensation reaction catalyst; and (D) a hydrolyzable organosilane compound having 3 or more nitrogen atoms per molecule and/or a partial hydrolytic condensate thereof.

2. The room-temperature-curable polybutadiene resin composition according to claim 1, wherein, in the component (A), the ingredient (A1) is a polybutadiene having OH groups respectively at both ends of the molecular chain thereof which has the general formula (1), the ingredient (A2) is a diisocyanate compound having the general formula (2), and the polycondensate of the ingredients (A1) and (A2) is a urethane oligomer having the general formula (3):

[Chem. 1]

$$HO{-}{\left[{\left(\phantom{\rule{0ex}{0ex}}\right)}_a{\left(\phantom{\rule{0ex}{0ex}}\right)}_b{\left(\phantom{\rule{0ex}{0ex}}\right)}_c\right]}_n{-}OH \qquad (1)$$

wherein n represents an integer of 10 to 500; a independently represents a positive number of 0.01 to 0.3, each of b and c independently represents a positive number of 0.01 to 0.98, and a+b+c is 1;

$$O{=}C{=}N{\text{-}}A{\text{-}}N{=}C{=}O \qquad (2)$$

wherein A represents a bivalent hydrocarbon group having 1 to 20 carbon atoms;

[Chem. 2]

$$HO{-}{\left[PB{-}O{-}\underset{O}{\overset{\parallel}{C}}{-}\underset{H}{\overset{}{N}}{-}A{-}\underset{H}{\overset{}{N}}{-}\underset{O}{\overset{\parallel}{C}}{-}O\right]}_m{-}PB{-}OH \qquad (3)$$

wherein PB represents a group having the following general formula:

[Chem. 3]

$${\left[{\left(\phantom{\rule{0ex}{0ex}}\right)}_a{\left(\phantom{\rule{0ex}{0ex}}\right)}_b{\left(\phantom{\rule{0ex}{0ex}}\right)}_c\right]}_n$$

wherein a, b, c, a+b+c and n are as defined above,

A is as defined above, and m represents an integer of 1 or more.

3. The room-temperature-curable polybutadiene resin composition according to claim 1, wherein the ingredient (A1) has a number average molecular weight of at least 1,000.

4. The room-temperature-curable polybutadiene resin composition according to claim 1, wherein the component (D) is an amino-group-containing hydrolyzable organosilane compound having the general formula (4) or (5) and/or a partial hydrolytic condensate thereof:

$$Y{=}N{-}Z{-}SiR_3 \qquad (4)$$

$$Y{-}NH{-}Z{-}SiR_3 \qquad (5)$$

wherein Y represents a monovalent or bivalent hydrocarbon group having 1 to 15 carbon atoms which contains 2 or more nitrogen atoms in the structure thereof; Z represents an unsubstituted or substituted bivalent hydrocarbon group having 1 to 10 carbon atoms which may contain a hetero atom; and R represents at least one kind of monovalent group selected from a hydrolyzable group having 1 to 6 carbon atoms and a monovalent hydrocarbon group having 1 to 6 carbon atoms, provided that at least two of three Rs bonded to silicon atom are hydrolyzable groups.

5. The room-temperature-curable polybutadiene resin composition according to claim 4, wherein Y represents a group having the formula (6) or (7):

[Chem. 4]

(6)

[Chem. 5]

(7)

wherein each of $R^1$ to $R^4$ independently represents a hydrogen atom, a linear, branched or cyclic alkyl group having 1 to 10 carbon atoms, alkenyl group or aryl group, and a wavy line part represents a bonding part with nitrogen-atom.

6. A coating material on an electric or electronic or on an on-board automotive part, wherein the coating material is prepared by curing a room-temperature-curable polybutadiene resin composition according to claim 1.

7. A packaged circuit board comprising a circuit board having an electrical or electronic part mounted thereon and a cured coating thereon, the cured coating being a cured product of the room-temperature-curable polybutadiene resin composition of claim 1.

8. The room-temperature-curable polybutadiene resin composition according to claim 1, consisting essentially of the components (A), (B), (C) and (D).

9. A cured coating film formed from the room-temperature-curable polybutadiene resin composition according to claim 1, having a thickness of 200 to 2,000 μm.

10. The room-temperature-curable polybutadiene resin composition according to claim 1, which provides a cured coating film having corrosion protection performance against corrosive gases.

11. The room-temperature-curable polybutadiene resin composition according to claim 1, wherein in component (B), the hydrolyzable organosilane compound is methyltrimethoxysilane, vinyltrimethoxysilane, phenyltrimethoxysilane, methyltriethoxysilane, vinyltriethoxysilane, n-propyltrimethoxysilane, n-hexyltrimethoxysilane, n-decyltrimethoxysilane, 1,6-bistrimethoxysilylhexane, dimethyldimethoxysilane, vinyldimethoxymethylsilane or dimethyldiethoxysilane.

12. The room-temperature-curable polybutadiene resin composition according to claim 1, wherein in component (B), the tetraalkoxysilane is tetraethoxysilane or tetramethoxysilane.

13. The room-temperature-curable polybutadiene resin composition according to claim 1, wherein in component (B), the ketoximesilane is methyltris(dimethylketoxime)silane, methyltris(methylethylketoxime)silane, ethyltris(methylethylketoxime)silane, methyltris(methylisobutylketoxime)silane or vinyltris(methylethylketoxime)silane.

14. The room-temperature-curable polybutadiene resin composition according to claim 1, wherein in component (B), the alkenoxysilane is methyltriisopropenoxysilane, vinyltriisopropenoxysilane or phenyltriisopropenoxysilane.

15. The room-temperature-curable polybutadiene resin composition according to claim 1, wherein in component (B), the acetoxysilane is methyltriacetoxysilane, ethyltriacetoxysilane or vinyltriacetoxysilane.

* * * * *